United States Patent [19]

Klank

[11] 4,193,686
[45] Mar. 18, 1980

[54] COUNTING CIRCUIT FOR DETERMINING THE INCOMING FREQUENCY OR RECEIVED CHANNEL IN A HIGH-FREQUENCY SUPERHET RECEIVER

[75] Inventor: Otto Klank, Arpke, Fed. Rep. of Germany

[73] Assignee: Licentia Patent-Verwaltungs-G.m.b.H., Fed. Rep. of Germany

[21] Appl. No.: 858,176

[22] Filed: Dec. 7, 1977

[30] Foreign Application Priority Data

Dec. 10, 1976 [DE] Fed. Rep. of Germany ....... 2655947

[51] Int. Cl.² ............................................. H04B 1/06
[52] U.S. Cl. ..................................................... 455/154
[58] Field of Search ............... 325/455, 457, 453, 315, 325/316, 317, 452, 454, 464, 467, 468; 331/64, 16, 17, 49

[56] References Cited

U.S. PATENT DOCUMENTS

| 3,949,307 | 4/1976 | Klank | 325/317 |
| 3,991,382 | 11/1976 | Iida et al. | 325/455 |
| 4,077,009 | 2/1978 | Klank | 325/455 |

Primary Examiner—Robert L. Griffin
Assistant Examiner—Tommy P. Chin
Attorney, Agent, or Firm—McGlew and Tuttle

[57] ABSTRACT

The counting circuit is particularly useful in a high-frequency superhet receiver including IF filters, such as ceramic filters, available as completed units having definite, pre-aligned IF values, and is of the type in which the oscillations of an AM or FM local oscillator, the frequency of which differs from that of the received signal by the frequency of the IF stage of the receiver, are counted periodically by an electronic counter with each such count taking place within a predetermined gate time. In such a counting circuit, during the counting operation, a number of oscillations correspondng to a predetermined fixed number of oscillations occurring at the IF of the receiver is either subtracted from or added to the oscillations of the AM or FM oscillator so that the count of the counter indicates the incoming frequency or received channel. The gate time is determined by the pulse duration of periodically generated pulses and, in accordance with the invention, deviations of the actual IF of the IF stage relative to the predetermined fixed value of the IF taken into account during the counting operation, are compensated by shifting the leading edge, determining the beginning of the gate time, to vary the duration of the periodically generated pulses. Such shifting of the leading edge can be effected in an RC circuit including either a potentiometer, fixed value voltage dividers, or a plurality of potentiometers selected by selector switches.

13 Claims, 2 Drawing Figures

COUNTING CIRCUIT FOR DETERMINING THE INCOMING FREQUENCY OR RECEIVED CHANNEL IN A HIGH-FREQUENCY SUPERHET RECEIVER

BACKGROUND OF THE INVENTION

1. Field of the Invention

This invention relates to the field of superheterodyne radio sets having digital frequency display means, and particularly to superheterodyne sets having fixed-tuned intermediate frequency filters.

2. The Prior Art

There are known superheterodyne radio sets in which the incoming frequency or received channel is not indicated on a scale but rather by a digital frequency or channel display. Such a radio receiver having a digital frequency or channel display is described, for example, in the German periodical "Funkschau" 1976, No. 9, pages 334–337. A digital indication is based on counting the oscillations of the local oscillator by means of electronic counters. The oscillations to be counted are counted periodically during a definite period of time under the control of a gate, so that each counting interval is referred to as the "gate time". Since, in superhet receivers, the received frequency or more specifically, the carrier frequency of the received signal, differs from the frequency of the oscillator by the value of the intermediate frequency (IF), the IF must be subtracted (or added). In the circuit of the prior art, this is obtained by pre-programming the counter stages of the electronic counter are pre-programmed, prior to the start of the counting, to an initial value such that, after a number of pulses produced during the gate time and corresponding to the intermediate frequency, the highest count or count "zero" of the counter is obtained. Then, the following pulses of the oscillator frequency, counted still within the gate time, exactly correspond to the incoming frequency. In this way, due to the pre-programming, the counted oscillator frequency is corrected by the value of the fixedly pre-programmed IF.

The disadvantage thereof is, however, that the fixed value of the pre-programmed IF is not always identical with the actual value of the IF which is determined by the filters used in the IF section. This is the case particularly if ceramic filters are employed, whose use is desirable because of their advantages. That is, as compared to coil filters, ceramic filters are relatively inexpensive. In their manufacture, they are automatically aligned, so that no subsequent trimming is possible. That is why with ceramic filters, in practice, the value of the IF varies from filter to filter. On the other hand, the fixed value for pre-programming the counting stages also is set in advance, prior to assembling the receiver. For this reason, frequently, and as mentioned, differences are found between the pre-programmed fixed value and the value of the ceramic filters. Such discrepancies entail an incorrect indication of the received frequency. If, for example, the value of the IF predetermined by the ceramic filter is greater than the pre-programmed fixed value, a too high incoming frequency is determined and indicated by the electronic counter. It is true that one might conceive of a subsequent re-programming of the already pre-programmed counting stages to a value corresponding to the respective filter. However, experience has indicated that this prociedure is very complicated and relatively expensive.

SUMMARY OF THE INVENTION

To obviate these disadvantages, the present invention is directed to a circuit arrangement making it possible to use the relatively inexpensive filters as finish manufactured component parts already aligned to a definite value, without having to change the pre-programming of the counter stages, and still to ensure a correct indication of the incoming frequency.

In accordance with the invention, the problem is solved, in a counting circuit for determining the incoming frequency or received channel in an HF superhet receiver, particularly HF superhet receivers including IF filters available as constructional units having definite, aligned IF values, and in which the oscillations of the local oscillator, whose frequency differs from that of the received signal by the number of oscillations of the IF stage of the receiver, are counted periodically with each count taking place within a predetermined gate time, and during which counting operation a number of oscillations corresponding to a predetermined fixed value of the IF of the receiver is arithmetically combined with the oscillations of the AM or FM local oscillator so that the count of the electronic counter, effecting the periodic count, indicates the incoming frequency or received channel, by varying the gate time during which each count takes place.

The invention is based on the concept that, in practice, the pre-programmed fixed value can be varied by varying the gate time which, in itself, is a predetermined fixed period. Each counting time, and thus each gate time, comprises two parts. During the first part, the counting takes place from the pre-programmed value to the count "zero", whereby the value of the IF is subtracted from the incoming frequency. Then, during the second part, starting from the count "zero" of the counter, the number of oscillations counted corresponds to the actual incoming frequency. Now, if the gate time is slightly shortened by a continuous shift, the second part of counting time, in which, after counting down from the pre-programmed fixed value, the incoming frequency is counted starting from the count "zero", is somewhat reduced. Therefore, there will only be time to counte a smaller number to represent for the incoming frequency. This, however, is the correct number due to the IF actually used. The change in the counting time is substantially equivalent to a change in the pre-programmed value, since this smaller number to represent the incoming frequency would be counted also in case of pre-programming a higher IF value with an unchanged gate time. The advantage of the invention is that the gate time can be varied substantially easier than, as would otherwise be necessary, the pre-programmed value. Thus, the variation of the gate time provides a simple way of aligning the IF according to the passband of the respective pre-aligned filter.

An object of the invention is to provide an improved counting circuit for determining the incoming frequency or the received channel in an HF superhet receiver, particularly HF superhet receivers including IF filters available as completed units having definite, pre-aligned IF values.

Another object of the invention is provide such a counting circuit including novel means for compensating deviations of the actual IF of the IF stage relative to a predetermined fixed value of the IF taken into account during a counting operation.

A further object of the invention is to provide such a counting circuit in which such compensation is effected by varying the gate time during which the IF oscillations and the incoming oscillations are counted, in a direction to reduce the deviations to zero.

For an understanding of the principles of the invention, reference is made to the following description of typical embodiments thereof as illustrated in the accompanying drawing.

DESCRIPTION OF THE PREFERRED EMBODIMENTS

Figure 1:
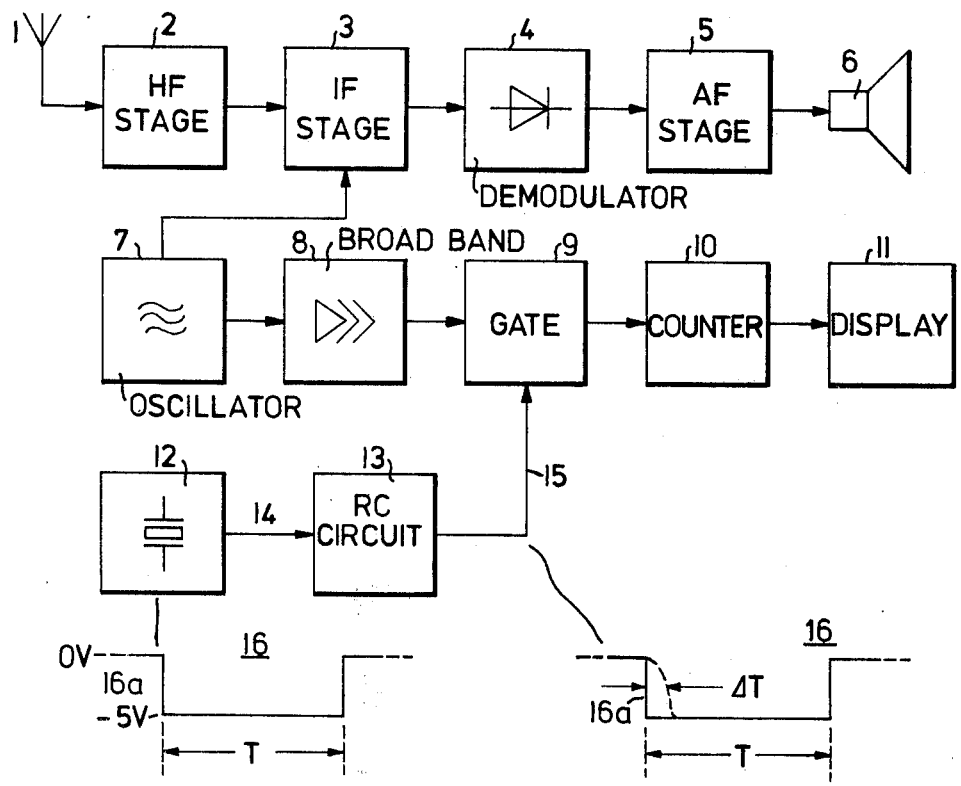
FIG. 1 is the basic circuit diagram of a high-frequency superhet receiver to which the invention is applied.

As shown in FIG. 1, the HF oscillations received by an antenna 1 are amplified in a high-frequency section or stage 2. In a mixer that forms part of an intermediate frequency, or IF, stage 3, the received HF oscillations are mixed with the oscillations of a local oscillator 7 whereby the signals are shifted to an intermediate frequency to be amplified in an IF amplifier section of the IF stage 3. These stages are followed by a demodulator 4 and an audio frequency amplifier, or AF state, 5 wherefrom the detected audio frequency is fed to a loudspeaker 6.

To display the incoming frequency in an indicator 11, the oscillations of oscillator 7 are counted by a counter 10 periodically, i.e. recurrently within a "gate time" T. For this purpose, oscillator 7 is connected to a broadband amplifier 8 in which the oscillator oscillations are amplified either in AM or in FM operation, depending on the reception range. The gate circuit block 9 indicates that the counting takes place periodically within the gate time T. A quartz oscillator 12 generates pulses 16 having a duration T equal to the gate time, which is the total counting time. Through a line 14 and a circuit 13, which is described in more detail hereinafter, pulses 16 are applied to gate circuit 9 which is enabled in each instance only during the pulse duration T, so that the oscillations of the oscillator can pass from broadband amplifier 8 to counter 10 only during the gate time T. Counter 10 is pre-programmed, in the above described manner, to a numerical value corresponding to the respective intermediate frequency (for example, to 460 kHz for AM and 10.7 Mhz for FM), whereby the numerical value of the IF is subtracted from the frequency of the oscillator. The circuitry described in the foregoing, with the exception of circuit 13, is known from the above cited periodical.

As shown in the lower left part of FIG. 1, the gate time is produced by a negative-going pulse 16. Within the period of the gate time T, the voltage level is, for example, $-5$ V, and, during the other time, 0 V. Let it now be assumed that counter 10 is pre-programmed to a value corresponding to an IF of 10.7 MHz. Let it also be assumed that the filter inserted in IF stage 3 as a completed unit and already aligned. For example, the filter may be a ceramic or quartz filter (not shown), that has a slightly higher IF, for example, of 10.8 MHz than the expected IF. With an assumed gate time T of 8 msec and an incoming frequency of, for example, 100 MHz, the counter 10 will determine, without the inventive arrangement, an incoming frequency higher by, for example, 100 kHz. That is, because of the pre-programming which is too low and thus "incorrect" relative to the actual intermediate frequency of IF stage 3, numerical value subtracted from the oscillator frequency will be too small so that too high an incoming frequency will be indicated.

To eliminate this error, means are provided in circuit 13, to be explained in more detail hereinafter with reference to FIG. 2, which make it possible to continuously vary the duration of pulses 16. As may be learned from FIG. 1, circuit 13 has the effect that the leading edges 16a of pulses 16, which are supplied through line 15 to gate circuit 9, are delayed by a time interval $\Delta T$. Consequently, gate circuit 9 is enabled for a time which is shorter by $\Delta T$ relative to the initial time T, so that the acual counting time of counter 10 is reduced. The result is that a smaller number of oscillations is counted than previously. This means, however, that instead of the above mentioned too high amount for the incoming frequency, the correct smaller amount is counted, provided that the time interval $\Delta T$ is correctly chosen. In the mentioned example, the error of 100 kHz is eliminated by a value $\Delta T = 8$ $\mu$sec. In this way, by a continuous variation of gate time T, the IF value determinative for the counting can be adjusted to the IF of the filter used in the IF stage.

Figure 2:
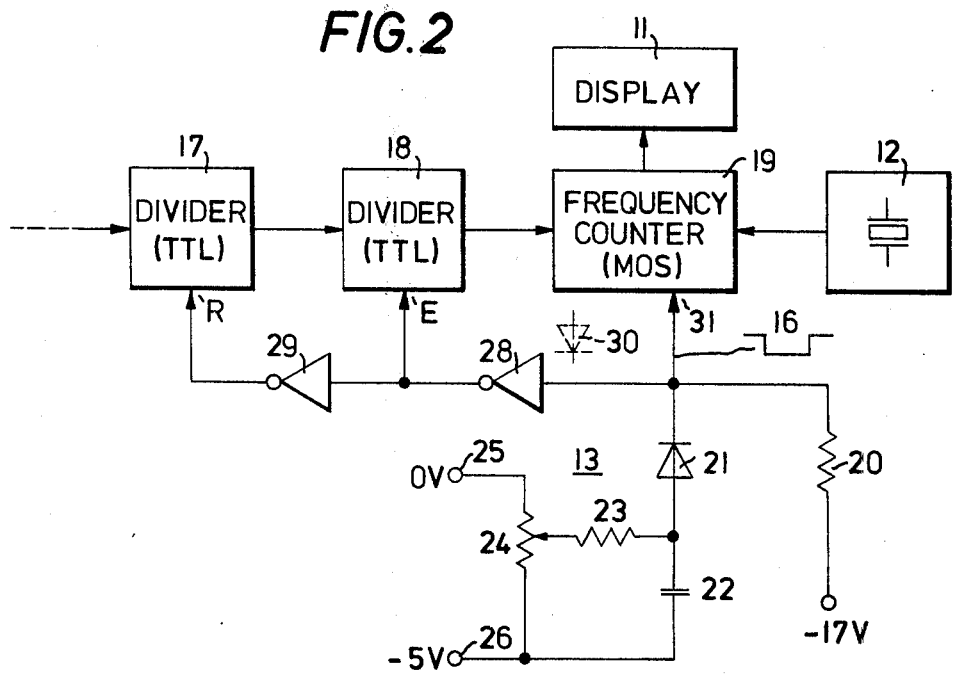
FIG. 2 shows a part of the circuitry of FIG. 1 embodying the circuit for continuously varying the gate time.

FIG. 2 illustrates an embodiment of circuit 13 forming part of the circuitry shown in FIG. 1. Elements corresponding to FIG. 1 are provided with identical reference numerals. The incoming oscillations of the AM or FM oscillator pass through preliminary divider stages 17 and 18 to a frequency counter 19 into which the gate time pulses 16, produced by quartz oscillator 12, are fed. Frequency counter 19 is designed, for example, as a MOS IC [metal oxide semiconductor integrated circuit] and comprises also the control circuit needed for the counting operation and an encoder for a seven-segment display 11 where the incoming frequency is to be indicated. As frequency counter 19, the MOS IC DFU 101 described in the above cited periodical may be used, for example. For preliminary dividers 17, 18, the TTL technique [transistor-transistor logic] is employed. Model SN 7490 may be used for divider 17, and model SN 7474 for divider 18, for example.

Circuit 13, for shifting the beginning of gate time T, comprises a potentiometer 24, a resistor 23, a diode 21, and a capacitor 22. Potentiometer 24 is connected through a terminal 25 to a 0 V voltage and, through another terminal 26, to $-5$V. The variable potentiometer pick-off, or tap, leads through resistor 23, to capacitor 22 which is thereby charged to an adjustable negative voltage. At the beginning of gate time T, due to pulses 16 appearing at the terminal 31 of frequency counter 19, capacitor 22 is discharged through diode 21. The result thereof is, as shown in FIG. 1 below at the right-hand side in a dotted line, that edge 16a and, thereby, the beginning of gate time T, is delayed by $\Delta T$. The effect obtained by diode 21 is that only the beginning of the gate time is delayed, while the end of the gate time remains unaffected. After expiration of the gate time, as the voltage jumps from $-5$ V to 0 v, capacitor 22 is charged again to its initial value, so that, at the next gate time pulse, the delay of the gate time beginning by $\Delta T$ caused by the discharge occurs again. The amount of the delay $\Delta T$ depends on the amount of the initial charge of capacitor 22. By varying the adjustment of the potentiometer 24, the initial charge of capacitor 22 and, thereby, the amount of the delay ΔT can be adjusted. In this simple way, by actuating potentiometer 24, the amount of the IF deviation can be aligned. According to FIG. 2, however, only an adjustment having a definite, preselected maximum value is possible as the total shift is limited by the capacitance. Resistor 20 serves as a load resistor for a switching transistor provided in frequency counter 19 at terminal 31, which provides a connection to 0 V outside the gate time T.

The pulses 16, shortened at their beginning in the described manner, pass through an inverter 28 to an enable input E of preliminary divider 18 and through another inverter 29 to a reset input R of preliminary divider 17. This control of dividers 17 and 18 has the effect that the dividers are in operating condition only during the gate time, so that the counting can take place periodically only within gate time T. Inverter 28, which is, for example, of the model 7404, comprises an internal diode 30 which is indicated in FIG. 2 in dotted lines. This diode is of importance insofar as the logic voltage levels of MOS IC 19 and of the TTL circuits 17, 18 differ from each other. In the TTL technique, the voltage of −5 V corresponds to the logic level "0" and the voltage of 0 V to logic level "1". By means of internal diode 30, a drop of the voltage below the value −5 V (TTL "0") is obtained. That is, as soon as the voltage level drops below −5 V, internal diode 30 becomes conducting and, thereby, prevents a further drop of the voltage.

In the example of FIG. 2, the gate time is varied continuously. It is also possible, however, to delay the beginning of the gate time in discrete steps and/or to provide selective switching, to be able to compensate different deviations of the IF, for example, in different ranges. For this purpose, instead of the potentiometer, fixed-value voltage dividers or a plurality of potentiometers may be provided, for selective switching.

The invention may be applied with particular advantage in the VHF range since, in this range, no ceramic filters having a satisfactory IF accuracy are available, wherefore the occurrence of deviations of the filter IF from the pre-programmed IF of the counting circuit is frequent.

While specific embodiments of the invention have been shown and described in detail to illustrate the application of the principles of the invention, it will be understood that the invention may be embodied otherwise without departing from such principles.

What is claimed is:
1. A superheterodyne receiver comprising:
 means to receive a desired signal occupying a predetermined band of frequencies identified by a first carrier frequency;
 an intermediate frequency stage comprising fixed-tuned filter means to determine an intermediate frequency band that can pass through said intermediate frequency stage, said band being identified by an actual intermediate carrier frequency;
 local oscillator means tunable to a frequency that differs from the first carrier frequency by the intermediate carrier frequency to shift said desired signal from said pre-determined band to said intermediate frequency band;
 counter means to count oscillations from said local oscillator for a pre-determined interval of time;
 means to modify the count of said counter by a fixed count corresponding to a nominal intermediate carrier frequency;
 numerical display means to display the final number counted by said counter means during said intervals; and
 adjustable means to set the length of said interval according to the actual intermediate carrier frequency so that the actual number counted during said interval corresponds to the first carrier frequency, whereby said display means displays the correct numerical value of said first carrier frequency to the degree of accuracy permitted by said final number counted.

2. The invention as defined in claim 1 in which said means to modify the count of said counter comprises means to add a signal corresponding to the actual intermediate carrier frequency to the number counted by said counter means during said interval.

3. The invention as defined in claim 1 in which said means to modify the count of said counter means comprises means to subtract a signal corresponding to the actual intermediate carrier frequency from the number counted by said counter means during said interval.

4. The invention as defined in claim 1 in which said counter is a programmable counter pre-programmed to count a first number of said oscillations of said local oscillator corresponding to a nominal intermediate carrier frequency during a first part of said interval and to count a second number of oscillations of said local oscillator during a second part of said interval, said display means displaying said second number.

5. The invention as defined in claim 4 in which said counter is a programmable counter and is programmed to count from said first number to zero during said first part of said interval and to count from zero to said second number during said second part of said interval.

6. The invention as defined in claim 1, in which said adjustable means comprises means to delay the start of said interval.

7. The invention as defined in claim 1 in which said adjustable means comprises:
 a gate circuit connected to said counter means to allow said counter means to count said oscillations for said interval, which is equal to the open interval of said gate circuit; and
 a controllable delay circuit connected to said gate circuit to delay the start of said gate interval.

8. The invention as defined in claim 7 in which said controllable delay circuit comprises;
 a capacitor;
 a variable resistor connected to said capacitor;
 voltage supply means to charge said capacitor; and
 means to connect said capacitor to said gate circuit to be discharged during the initial part of said gate interval and thereby to counteract said initial part of said gate interval to delay the effective start of said gate interval.

9. The invention as defined in claim 8 in which said means to connect said capaticor comprises a diode connected between said gate circuit and said capacitor and polarized to be conductive during the initial part of said gate interval.

10. The invention as defined in claim 7 comprising frequency dividing means connecting said local oscillator to said counter.

11. The invention as defined in claim 7 in which said gate circuit produces negatively polarized pulses, and said delay circuit further comprises:

a capacitor;

first connection means connecting said gate circuit to said capacitor to supply said negatively polarized pulses to said capacitor;

a voltage divider;

second connection means connecting said voltage divider to said capacitor to supply charge to said capacitor; and means operable to discharge said capitor during an initial part of each gate interval to delay the leading edge of each of said negatively polarized pulses.

12. The invention as defined in claim 11 in which said voltage divider is a continuously variable potentiometer comprising an arm, said capacitor being connected in series between said arm and one end terminal of said potentiometer.

13. The invention as defined in claim 11 in which said voltage divider is a potentiometer variable in steps and comprising an arm movable from step to step, said capacitor being connected in series between said arm and a fixed voltage terminal.

* * * * *